United States Patent [19]

Benchimol et al.

[11] Patent Number: 4,532,001
[45] Date of Patent: Jul. 30, 1985

[54] PROCESS FOR THE LIQUID PHASE EPITAXIAL DEPOSITION OF A MONOCRYSTALLINE TERNARY COMPOUND

[76] Inventors: Jean-Louis Benchimol, 5, Rue Loredde, 75013 Paris; Maurice Quillec, 17, Rue Emile Dubois, 75014 Paris, both of France

[21] Appl. No.: 452,920

[22] Filed: Dec. 27, 1982

[30] Foreign Application Priority Data

Dec. 28, 1981 [FR] France .................... 81 24291

[51] Int. Cl.$^3$ ............................................. C30B 19/04
[52] U.S. Cl. ........................................ 156/622; 156/624; 156/DIG. 70
[58] Field of Search ....... 156/622, 624, 621, DIG. 70, 156/DIG. 72, DIG. 77, DIG. 81, DIG. 82; 148/171, 172, DIG. 101; 423/508, 511

[56] References Cited

U.S. PATENT DOCUMENTS

| 3,897,281 | 7/1975 | Gilbert et al. ................ | 148/171 |
| 4,179,317 | 12/1979 | Sakai et al. .................... | 148/171 |
| 4,401,487 | 8/1983 | Lockwood ...................... | 156/624 X |

FOREIGN PATENT DOCUMENTS 2151171 4/1973 France .
2183522 12/1973 France .

OTHER PUBLICATIONS

Abstract (English) to French Patents 2,151,171 and 2,183,522.

Primary Examiner—Hiram H. Bernstein
Assistant Examiner—Michael S. Gzybowski
Attorney, Agent, or Firm—Pearne, Gordon, Sessions, McCoy, Granger & Tilberry

[57] ABSTRACT

Process for the liquid phase epitaxial deposition on a substrate of a ternary compound crystallizing in the same system as the substrate and complying with formula $A_xB_{n-x}C_m$ in which A, B and C are elements of the periodic classification of elements, n and m are integers, which can be the same or different, and x is between O and n, wherein said process comprises:

(a) preparing an epitaxy bath by raising one of the elements A or B of the ternary compound and a stoichiometric solid binary compound of the two other elements of the ternary compound to a temperature such that there is formed with an excess of the said binary compound in the solid state, a liquid phase whose composition corresponds to the equilibrium with the solid phase $A_xB_{n-x}C_m$, (b) contacting the bath with the substrate to be coated, and (c) depositing thereon, the ternary compound $A_xB_{n-x}C_m$.

10 Claims, 4 Drawing Figures

PROCESS FOR THE LIQUID PHASE EPITAXIAL DEPOSITION OF A MONOCRYSTALLINE TERNARY COMPOUND

BACKGROUND OF THE INVENTION

The present invention relates to a process for the deposition by liquid phase epitaxy of a monocrystalline ternary compound of formula $A_xB_{n-x}C_m$ in which A, B and C are elements of the periodic classification of elements, n and m are integers and x is between 0 and n.

It is more particularly applicable to compounds of types III-V or II-VI, which are compounds of formula $A_xB_{1-x}C$ in which A, B and C are elements belonging to groups II, III, V and VI of the periodic classification of elements and x is between 0 and 1. Furthermore, A and B belong to the same group of the periodic classification and C belongs to a different group.

Most of the compounds of this type are of considerable interest due to their semiconducting properties.

Among the known processes for the deposition of crystalline layers of ternary compounds of this type, liquid phase epitaxy is widely used and consists of growing on a monocrystalline substrate a layer of solid material depositied from a supersaturated liquid phase. The composition of the solid deposited on the substrate depends on the composition of the supersaturated liquid phase and the temperature used. For preparing the epitaxy bath, the quantities of the different constituents are initially weighed to have the desired composition and then the mixture of constituents is raised to the temperature necessary for forming the supersaturated liquid phase. The thus obtained bath is then contacted with the substrate to be coated by operating either at constant temperature, or at a decreasing temperature in order to compensate the composition variations of the bath during the growth of the epitactic layer.

For the preparation of ternary compounds of formula $InAs_{1-x}Sb_x$ with x between 0 and 1, a liquid phase epitaxial deposition process is also known, in which an epitaxy bath is prepared by weighing appropriate quantities of polycrystalline indium arsenide, indium and antimony and by then heating the thus obtained mixture at the desired temperature for dissolving the indium arsenide and for saturating the bath. This is followed by deposition, by introducing the substrate to be coated and the indium arsenide source into the bath and by establishing a temperature gradient between the source of the binary compound InAs raised to temperature $T_1$ and the substrate to be coated raised to temperature $T_2$, which is lower than $T_1$ (J. Electrochem. Soc., vol. 118, no. 5, 1971, pp. 805-810). In this way it is ensured that the liquid phase of the bath is subsaturated compared with the source of the binary compound InAs and that it is supersaturated compared with the growth substrate.

The layer can therefore be grown at a constant temperature, because the liquid phase is supplied with the two constituents of the bath by dissolving the source of the binary compound InAs. However, throughout the operation, it is necessary to establish a temperature gradient between the source and the growth substrate.

These known processes have the disadvantages of the initial composition of the epitaxy bath having to be accurately determined, which involves a careful calculation and control of the mass of the different constituents of the bath, whilst the composition of the layer obtained is not homogeneous over its entire thickness, which imposes certain limitations regarding the thickness of the deposited layers.

Thus, the composition of the solid generally differs from that of the liquid phase in equilibrium therewith. Therefore the composition of the epitaxy bath varies during the deposition operation and consequently there are variations in the composition of the deposited solid. However, in the case of the preparation of the compound $InAs_{1-x}Sb_x$, in which there is an excess of the binary compound InAs, a slower variation of the bath composition is obtained and this makes it possible to obtain thicker layers with a reduced composition gradient. However, in the latter case, it is necessary to use a special apparatus for establishing a controlled temperature gradient in the epitaxy crucible, which makes the epitaxy process more complicated and less suitable for industrial utilization.

BRIEF SUMMARY OF THE INVENTION

The invention relates to a liquid phase epitaxy process, which obviates the disadvantages of the known processes.

The present invention specifically relates to a process for the liquid phase epitaxial deposition on a substrate of a ternary compound crystallizing in the same system as the substrate and complying with formula $A_xB_{n-x}C_m$ in which A, B and C are elements of the periodic classification of elements, n and m are integers, which can be the same or different, and x is between 0 and n, wherein it comprises:

(a) preparing an epitaxy bath by raising one of the elements A or B of the ternary compound and a stoichiometric solid binary compound of the two other elements of the ternary compound to a temperature such that there is formed with an excess of the said binary compound in the solid state, a liquid phase whose composition corresponds to the equilibrium with the solid phase $A_xB_{n-x}C_m$, (b) contacting the bath with the substrate to be coated, and (c) depositing thereon, the ternary compound $A_xB_{n-x}C_m$.

In general, n and m are integers between 1 and 3.

The process according to the invention has the particular advantage of not requiring a precise calculation and a weighing of the masses of the constituents to be introduced into the epitaxy bath.

Thus, due to the fact that an epitaxy bath having concentrations in two of the elements of the ternary compound corresponding to the concentrations of these elements in the stoichiometric binary compound for deposition purposes, and due to the fact that the deposition of the layer takes place in the presence of an excess of this binary compound, it is possible to simplify the preliminary operations of preparing the bath, because it is merely necessary to raise to the desired temperature, one of the elements of the ternary compound in the presence of an excess of the binary compound in order to obtain the desired bath composition.

According to the invention, the binary compound used can be a compound of B and C or a compound of A and C.

According to a first embodiment of the process according to the invention, the binary compound is a compound of B and C and the epitaxy bath is prepared by raising element A and the solid stoichiometric binary compound of formula $B_nC_m$ to a temperature such that there is formed, with an excess of the binary compound $B_nC_m$ in the solid state, a liquid phase whose composition corresponds to the equilibrium with the solid phase $A_xB_{n-x}C_m$.

According to a second embodiment of the process according to the invention, the binary compound is a compound of A and C, and the epitaxy bath is prepared by raising element B and the solid stoichiometric binary compound of formula $A_nC_m$ to a temperature such that there is formed, with an excess of said binary compound $A_nC_m$ in the solid state, a liquid phase whose composition corresponds to the equilibrium with the solid phase $A_xB_{n-x}C_m$.

In both embodiments of the process according to the invention, the composition of the epitaxy bath is controlled by acting solely on the temperature which is raised either the mixture of B and binary compound $A_nC_m$, or the mixture of A and binary compound $B_nC_m$.

This temperature is very close to the liquidus temperature of the liquid phase of A, B and C having concentrations in A and C or concentrations in B and C respectively corresponding to the compounds $A_nC_m$ or $B_nC_m$, which is in equilibrium with the solid phase $A_xB_{n-x}C_m$. The liquidus temperature can be determined from the phase diagrams of the ternary compound of A, B and C.

Thus, liquidus temperatures of the solid phases in equilibrium with $A_xB_{n-x}C_m$ are obtained and these temperatures are then experimentally checked.

For the performance of the process according to the invention, the epitaxy bath is prepared by raising the mixture of A and binary compound $B_nC_m$ or the mixture of B and binary compound $A_nC_m$ to a temperature slightly below the liquid temperature, as determined hereinbefore. Thus, it has been found that when a liquid phase of A, B and C are brought together with the binary compound $A_nC_m$ or $B_nC_m$ at a temperature T, the final state of the liquid phase is automatically a supersaturation state. Thus, for obtaining the liquid phase composition corresponding to the equilibrium with the solid phase, it is necessary to operate at a temperature slightly below the liquidus temperature of said liquid phase.

Moreover, it is possible according to the invention to take advantage of the supersaturation state resulting from the presence of an excess of compound $A_nC_m$ or $B_nC_m$ for carrying out epitaxial deposition by working at a constant and uniform temperature.

Thus, for the deposition, it is not necessary to establish a thermal gradient between the source of the binary compound $A_nC_m$ or $B_nC_m$ and the substrate to be coated, because the supersaturation of the liquid phase in contact with the binary compound source is automatically obtained at a temperature below the liquidus temperature.

Thus, deposition can take place on the substrate by raising it to the same temperature as the epitaxy bath, i.e. to a temperature slightly below the liquidus temperature of the liquid phase of A, B and C, which corresponds to the equilibrium with the solid phase $A_xB_{n-x}C_m$.

Generally working takes place at a temperature which is a few degrees below the liquidus temperature. The choice of this temperature is determined on the basis of theoretical data, which are then experimentally checked.

The process of the invention is more particularly applicable to the liquid phase epitaxial deposition of ternary compounds of types III-V and II-VI. However, it can also be used for the deposition of compounds of types VI-VI, III-VI, II-V, IV-VI and II-IV-VI.

Examples of compounds of type III-V are $Ga_xIn_{1-x}As$, $As_xSb_{1-x}Ga$, $As_xSb_{1-x}In$, and $P_xSb_{1-x}Ga$.

Such compounds can be prepared by using different deposition substrates adapted to the compound to be prepared. Thus, for producing $Ga_xIn_{1-x}As$ by using an epitaxy bath formed from In and an excess of the binary compound GaAs, it is possible to use InP as the substrate. On preparing the compound $As_xSb_{1-x}Ga$ by using a bath obtained from Sb and an excess of the compound GaAs, it is possible to use a GaSb substrate. The same substrate can be used on preparing compound $As_xSb_{1-x}In$ from a bath formed from Sb and an excess of InAs. On preparing the compound $P_xSb_{1-x}In$ by using an epitaxy bath formed from Sb and the binary compound InP, it is possible to use a GaSb or InAs substrate.

Finally, on forming the ternary compound $P_xSb_{1-x}Ga$ by using a bath formed from Sb and the binary compound GaP, it is possible to use GaAs or InP as the substrate.

Examples of compounds of type II-VI which can be used are given below:

| | | |
|---|---|---|
| $Zn_xCd_{1-x}Se$, | $Zn_xCd_{1-x}Te$, | $Zn_xHg_{1-x}Te$, |
| $Zn_xHg_{1-x}Se$, | $Cd_xHg_{1-x}Se$, | $Cd_xHg_{1-x}Te$, |
| $Zn_xCd_{1-x}S$, | $Zn_xCd_{1-x}Se$, | $Zn_xCd_{1-x}Te$, |
| $Zn_xHg_{1-x}S$, | $S_xSe_{1-x}Zn$, | $S_xTe_{1-x}Zn$, |
| $S_xSe_{1-x}Cd$, | $S_xTe_{1-x}Cd$, | $Se_xTe_{1-x}Zn$, |
| $Se_xTe_{1-x}Cd$ and | $Se_xTe_{1-x}Hg$. | |

The following table indicates the constituents (binary compounds AB and solvents C) which can be used in the epitaxy bath in order to obtain the different compounds of types II-VI appearing in the boxes of the table.

TABLE

| solvent (C) | Materials II-VI Binary compound (AB) | | | | | | |
|---|---|---|---|---|---|---|---|
| | ZnS | ZnSe | ZnTe | CdSe | CdTe | HgSe | HgTe |
| Zn | | | | $Zn_xCd_{1-x}Se$ | $Zn_xCd_{1-x}Te$ | $Zn_xHg_{1-x}Se$ | $Zn_xHg_{1-x}Te$ |
| Cd | $Zn_xCd_{1-x}S$ | $Zn_xCd_{1-x}Se$ | $Zn_xCd_{1-x}Te$ | | | $Cd_xHg_{1-x}Se$ | $Cd_xHg_{1-x}Te$ |
| Hg | $Zn_xHg_{1-x}S$ | $Zn_xHg_{1-x}Se$ | $Zn_xHg_{1-x}Te$ | $Zn_xHg_{1-x}Se$ | $Cd_xHg_{1-x}Te$ | | |
| S | | $S_xSe_{1-x}Zn$ | $S_xTe_{1-x}Zn$ | $S_xSe_{1-x}Cd$ | $S_xTe_{1-x}Cd$ | | |
| Se | $S_xSe_{1-x}Zn$ | | $Se_xTe_{1-x}Zn$ | | $Se_xTe_{1-x}Cd$ | | $Se_xTe_{1-x}Hg$ |
| Te | $S_xTe_{1-x}Zn$ | $Se_xTe_{1-x}Zn$ | | $Se_xTe_{1-x}Cd$ | | $Se_xTe_{1-x}Hg$ | |

PbSnTe is an example of a type IV-VI compound. PbCdS and PbCdSe are examples of compounds of types II-IV-VI.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

This embodiment relates to the deposition of a $In_{0.53}Ga_{0.47}As$ layer on a InP substrate. On the basis of the InGaAs system phase diagram, the composition of the InGaAs liquid phase is determined which has the same concentration of Ga and As, whilst being in equilibrium with the solid $In_{0.53}Ga_{0.47}As$, as well as the corresponding liquidus temperature.

Figure 1:
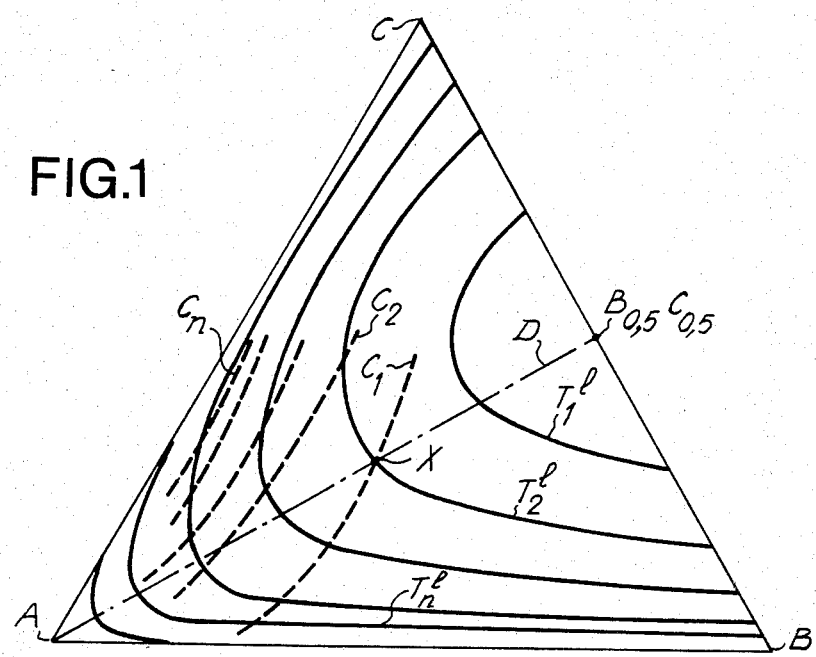
FIG. 1 the ternary diagram of the phases of a ternary system ABC.

FIG. 1 shows a ternary diagram illustrating, in the case of a ternary compound ABC, the different curves used for determining the liquidus temperature with a view to obtaining a compound of formula $A_xB_{1-x}C$.

The continuous line curves or liquidus curves illustrate the compositions of the liquid phases having the same liquidus temperature $T_1^1, T_2^1 \ldots T_n^1$, the dashed or isosolidus curves represent the liquid compositions in equilibrium with the same solid phase of composition $C_1, C_2 \ldots C_n$ and the mixed line curve D represents the liquid compositions having the same concentration of B and C.

The intersection at point X of the liquidus curve $T_2^1$ and the mixed line curve D and the isosolidus curve $C_1$, gives the temperature $T_2^1$ at which the process according to the invention is performed for obtaining by epitaxy the solid $A_xB_{1-x}C$ corresponding to composition $C_1$. Only solid compositions corresponding to such a point X can be grown according to the invention.

In the case of the ternary system InGaAs, a temperature of 505° C. is used for obtaining a solid phase $In_{0.53}Ga_{0.47}As$, when using a bath obtained from In and oriented GaAs (100).

When the compound which it is wished to obtain by epitaxy is in accordance with formula $A_xB_{n-x}C_m$ with $n \neq m$, the liquidus temperature is determined in the same way but using, in place of curve D, curve D' of the liquid compositions, whose ratio of the B/C concentrations remains equal to n/m.

After carrying out this determination the liquidus temperature is experimentally checked by using the so-called "single phase" method. In this case, the composition of the liquid is obtained by weighing the constituents and the liquidus temperature $T^1$ is measured by direct display, working in a semitransparent furnace. The epitactic solid is then analyzed by X-ray diffraction or by an electronic microprobe and the composition of the liquid is readjusted until the solid phase $In_{0.53}Ga_{0.47}As$ is obtained. Thus, the liquidus temperature is 499° C.

Following this operation, the degree of supersaturation of the In, Ga and As liquid bath is determined in the presence of an excess of the binary compound GaAs. For this purpose pure indium is brought together with a small plate of oriented GaAs (100) at a temperature of 500° C., by dissolving for a sufficiently long period of approximately 30 minutes in order to obtain a homogeneous liquid phase InGaAs having equal concentrations of Ga and As and with a GaAs excess.

The GaAs plate in liquid phase excess is then removed, followed by the measurement of the liquidus temperature of the thus obtained liquid phase by direct display in a semitransparent furnace. It corresponds to 504° C. Thus, the liquid phase InGaAs brought together with GaAs is supersaturated by 4° C. For obtaining by the process according to the invention of a deposition by epitaxy of $In_{0.53}Ga_{0.47}As$, it is necessary to work at a temperature of 499°-4° C., i.e. a temperature of 495° C.

Figure 2A:
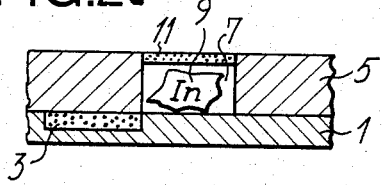
FIG. 2a diagrammatically the epitaxy and 2b crucible.
Figure 2B:
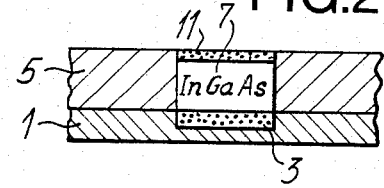

Epitaxy is carried out in an epitaxy apparatus having a graphite crucible placed in a quartz tube under a hydrogen flux. As shown in FIG. 2a, the crucible comprises a fixed part 1 having recesses, such as 3, in which are placed an oriented (100) InP growth substrate and a moving part in the form of a slide 5 having recesses 7, into which is introduced a piece of indium 9, which is covered by an oriented (100) GaAS substrate 11. The quartz tube is then heated to bring the indium piece and the GaAs substrate to a temperature of 495° C., which is maintained for 30 minutes in order to homogenize the bath. The liquid bath temperature is checked by means of a thermocouple arranged in a quartz rod used for the displacement of slide 5. Slide 5 (FIG. 2b) is then moved, so as to bring the InP growth substrate 3 beneath the epitaxy bath 7, whilst maintaining the temperature at 495° C. This leads to the deposition of a 3 μm thick epitactic layer of $In_{0.53}Ga_{0.47}As$ with a growth rate of approximately 0.1 μm/mn. Following deposition, the properties of the layer obtained are checked by X-ray diffraction on planes 400.

Figure 3:
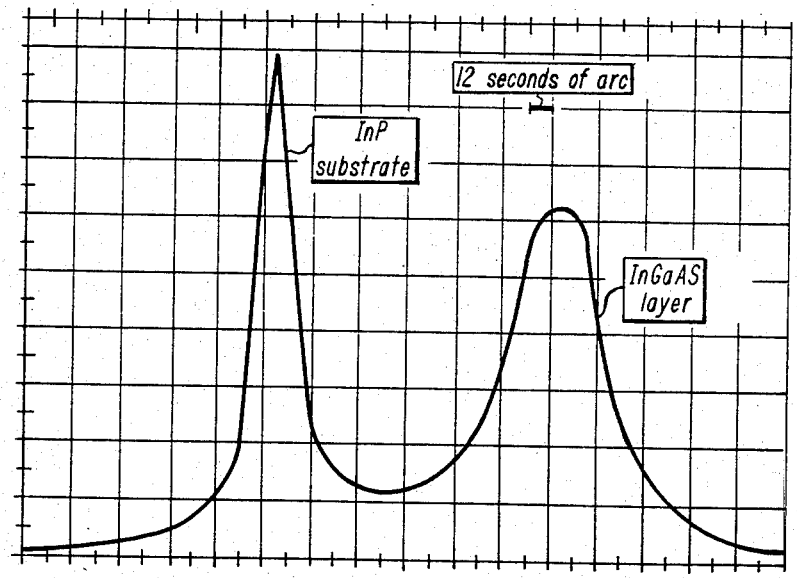
FIG. 3 a X-ray diffraction profile of a $In_{0.53}Ga_{0.47}As$ layer obtained according to the invention.

FIG. 3 shows the double diffraction profile obtained. It is possible to see the angular variation between the peaks associated with the epitactic layer and the InP substrate corresponds to a mesh unbalance of 0.1, whilst the width of the peak associated with the layer indicates very good epitaxy.

What is claimed is:

1. A process for liquid phase epitaxial deposition on a substrate of a ternary compound crystallizing in the same orientation as the substrate and complying with formula $A_xB_{n-x}C_m$ in which A, B and C are elements of the periodic classification of elements, n and m are natural numbers, which can be the same or different, and x is between 0 and n, comprising the steps of:
   (a) preparing a liquid epitaxy bath containing an excess of the binary stoichiometric compound of formula $B_nC_m$ in a solid monocrystalline oriented state and having molar concentrations of elements B and C such that the relation of the molar concentration of B to the molar concentration of C is equal to n/m, the bath being prepared by heating element A of the ternary compound and an excess of the solid compound $B_nC_m$ at a temperature such that there is formed a liquid phase with a composition corresponding to the equilibrium with the solid phase $A_xB_{n-x}C_m$ and an excess of the binary compound $B_nC_m$ in the solid state;
   (b) contacting the bath with the substrate to be coated; and
   (c) depositing thereon the ternary compound $A_xB_{n-x}C_m$.

2. A process for liquid phase epitaxial deposition on a substrate of a ternary compound crystallizing in the same orientation as the substrate and complying with formula $A_xB_{n-x}C_m$ in which A, B and C are elements of the periodic classification of elements, n and m are natural numbers, which can be the same or different, and x is between 0 and n, comprising the steps of:
   (a) preparing a liquid epitaxy bath containing an excess of the binary stoichiometric compound of formula $A_nC_m$ in a solid monocrystalline oriented state and having molar concentrations of elements A and C such that the relation of the molar concentration of A to the molar concentration of C is equal to n/m, the bath being prepared by heating element B of the ternary compound and an excess of the solid compound $A_nC_m$ at a temperature such that there is formed a liquid phase with a composition corresponding to the equilibrium with the solid phase $A_xB_{n-x}C_m$ and an excess of the binary compound $A_nC_m$ in the solid state, a liquid phase whose composition corresponds to the equilibrium with the solid phase $A_xB_{n-x}C_m$;

(b) contacting the bath with the substrate to be coated; and (c) depositing thereon the ternary compound $A_xB_{n-x}C_m$.

3. A process according to claim 1 or claim 2, wherein the ternary compound is a compound of type III-V of formula $A_xB_{n-x}C_m$ in which n and m are equal to 1, said compound being chosen from the group consisting of $Ga_xIn_{1-x}As$, $As_xSb_{1-x}Ga$, $As_xSb_{1-x}In$, $P_xSb_{1-x}In$ and $P_xSb_{1-x}Ga$.

4. A process according to claim 1 or claim 2, wherein the ternary compound is a compound of type II-VI of formula $A_xB_{n-x}C_m$ in which n and m are equal to 1, said compound being chosen from among the following compounds: $Zn_xCd_{1-x}Se$, $Zn_xCd_{1-x}Te$, $Zn_xHg_{1-x}Te$, $Zn_xHg_{1-x}Se$, $Cd_xHg_{1-x}Se$, $Cd_xHg_{1-x}Te$, $Zn_xCd_{1-x}S$, $Zn_xCd_{1-x}Se$, $Zn_xCd_{1-x}Te$, $Zn_xHg_{1-x}S$, $S_xSe_{1-x}Zn$, $S_xTe_{1-x}Zn$, $S_xSe_{1-x}Cd$, $S_xTe_{1-x}Cd$, $Se_xTe_{1-x}Zn$, $Se_xTe_{1-x}Cd$ and $Se_xTe_{1-x}Hg$.

5. A process according to any one of claims 1 or 2, wherein the temperature is determined from a phase equilibrium diapgram, and is the point x at the insection of a isosolidus curve and the curve representing the composition $B_nC_m$ or $A_nC_m$ of the binary compound.

6. A process according to any one of claim 1 or 2 wherein deposition takes place by contacting the substrate with the epitaxy bath while keeping the bath at a constant temperature and allowing the substrate to be at the same temperature as the epitaxy liquid bath.

7. A process according to claim 6 wherein the state of supersaturation of the liquid phase of A, B and C is established by the presence of the binary compound in the monocrystalline oriented state.

8. A process according to claim 1 or claim 2, wherein the ternary compound complies with formula $In_{0.53}Ga_{0.47}As$.

9. A process according to claim 8, wherein said process consists of:

(a) preparing an epitaxy bath by raising the indium and GaAs to a temperature of approximately 495° C., (b) bringing this bath into contact with the substrate to be coated, and (c) depositing the compound $In_{0.53}Ga_{0.47}As$ on the substrate maintained at a temperature of 495° C.

10. A process according to claim 9, wherein the substrate is constituted by oriented InP (100).

* * * * *